(12) United States Patent
Miller et al.

(10) Patent No.: US 9,111,647 B2
(45) Date of Patent: Aug. 18, 2015

(54) SYSTEM IN A PACKAGE (SIP)

(71) Applicants: Gary L. Miller, Austin, TX (US); Derek J. Beattie, Giffnock (GB)

(72) Inventors: Gary L. Miller, Austin, TX (US); Derek J. Beattie, Giffnock (GB)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 111 days.

(21) Appl. No.: 14/135,387

(22) Filed: Dec. 19, 2013

(65) Prior Publication Data

US 2015/0179286 A1    Jun. 25, 2015

(51) Int. Cl.
*H01L 23/34* (2006.01)
*H01L 21/82* (2006.01)
*G11C 11/34* (2006.01)
*G11C 7/00* (2006.01)
*G11C 29/00* (2006.01)
*G11C 14/00* (2006.01)

(52) U.S. Cl.
CPC .............. *G11C 29/789* (2013.01); *G11C 14/00* (2013.01)

(58) Field of Classification Search
CPC ................................ G11C 29/789; G11C 14/00
USPC ............... 257/724; 438/128; 365/185.08, 200
See application file for complete search history.

(56) References Cited

U.S. PATENT DOCUMENTS

| | | | |
|---|---|---|---|
| 5,852,712 A | 12/1998 | Allen et al. | |
| 7,397,703 B2 * | 7/2008 | Niset et al. | 365/185.22 |
| 7,738,309 B2 | 6/2010 | Jeon et al. | |
| 7,768,847 B2 * | 8/2010 | Ong et al. | 365/200 |
| 8,437,188 B2 * | 5/2013 | Kajigaya | 365/185.08 |
| 2012/0213022 A1 | 8/2012 | Yang et al. | |
| 2013/0064026 A1 | 3/2013 | Chou et al. | |

OTHER PUBLICATIONS

U.S. Appl. No. 13/775,313, Miller, G., "Methods and Systems for Address Mapping Between Host and Expansion Devices Within System in Package (SiP) Solutions", filed Feb. 25, 2013.

* cited by examiner

*Primary Examiner* — Luan C Thai

(57) ABSTRACT

A system in a package (SiP) includes a first semiconductor die having a nonvolatile memory and trim/repair circuitry, and a second semiconductor die having a volatile memory and trim/repair circuitry. The first and the second semiconductor die are in a same package. The nonvolatile memory of the first semiconductor die is configured to store trim/repair values for each of the first and the second semiconductor die. The trim/repair circuitries of the first and second semiconductor die are configured to, in response to a reset of the second semiconductor die, copy the trim/repair values from the nonvolatile memory of the first semiconductor die to the volatile memory of the second semiconductor die.

20 Claims, 2 Drawing Sheets

SYSTEM IN A PACKAGE (SIP)

BACKGROUND

1. Field

This disclosure relates generally to integrated circuits, and more particularly to system in a package (SiP) technology.

2. Related Art

A system in a package is a device including multiple semiconductor die in a single package. This is particularly efficient in terms of cost and performance for situations in which circuits using different process technology are connected together to perform a function. For example, it is common for analog circuits to be optimized using a different process technology than the process technology used for optimizing digital circuits. Thus both the digital and analog circuits can be optimized while still being in the same package. This makes for efficient use of space in implementing the system while retaining optimum performance.

Accordingly there is a continuing need to provide further improvement in implementing SiPs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A system in a package (SiP) includes a non-volatile memory (NVM) that stores trim/repair values for functional die of the SiP in addition to die that includes the NVM. At start-up these trim/repair values are copied from the NVM to the functional die for use by the functional die during operation of the functional die.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
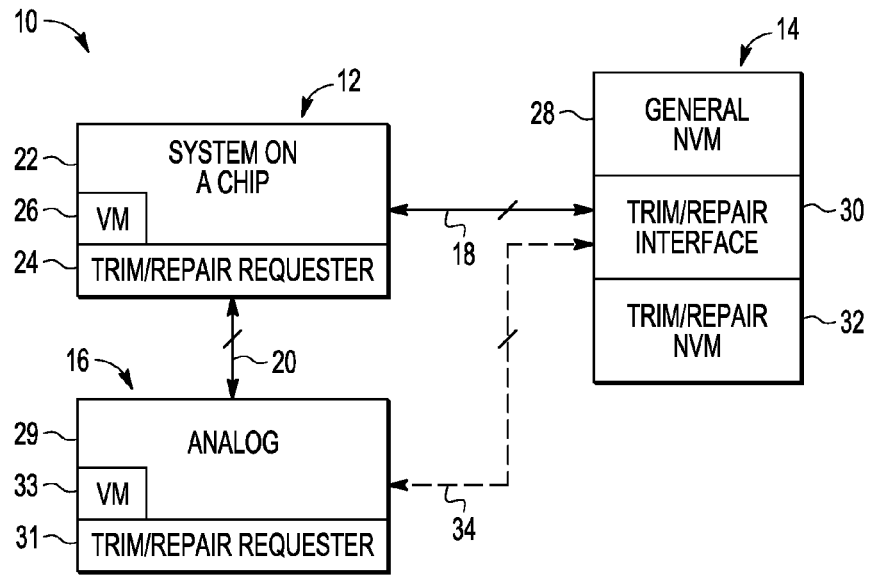
FIG. 1 is a block diagram of a system in a SiP having semiconductor die that use trim/repair values.

Shown in FIG. 1 is a block diagram of a system in a package (SiP) 10 having a system on a chip (SoC) die 12, an NVM die 14, and an analog die 16. SoC die 12 is coupled to NVM die 14 by a bus 18 to analog die 16 by a bus 20. SoC die 12 includes an SoC circuit 22, a trim/repair requester 24, and a volatile memory (VM) 26 and may contain other circuitry as well. NVM die 14 includes a general NVM 28, a trim/repair interface 30, and a trim/repair NVM 32 and also may further contain other circuitry. Analog die 16 includes an analog circuit 29, a trim/repair requester 31, and a VM 33 and similarly may contain other circuitry. SiP 10 has SoC die 12, NVM die 14, and analog die 16 together in a single package. The term "trim/repair" refers to trim or repair or both. Thus, trim/repair values may refer to values for use in implementing a memory repair or a circuit trim or a portion may be for a repair and another portion for a trim. A common repair is implementing redundancy in a memory in which a redundant row or column is used in place of a row or column that has been found to be defective. A common trim is to select a resistor value used in providing a more accurate reference voltage or a more precise delay. Trim/repair NVM 32 may be a flash memory or other type of non-volatile memory that uses charge storage but could be another type of non-volatile memory as well. E-fuse and MRAM are some other types, for example. In this configuration as described, operation in accessing NVM die 14 may be performed, for example, in daisy chain fashion. As an alternative, a bus 34 may be added between analog die 16 and NVM 14 to enable parallel operation with NVM die 14.

Figure 2:
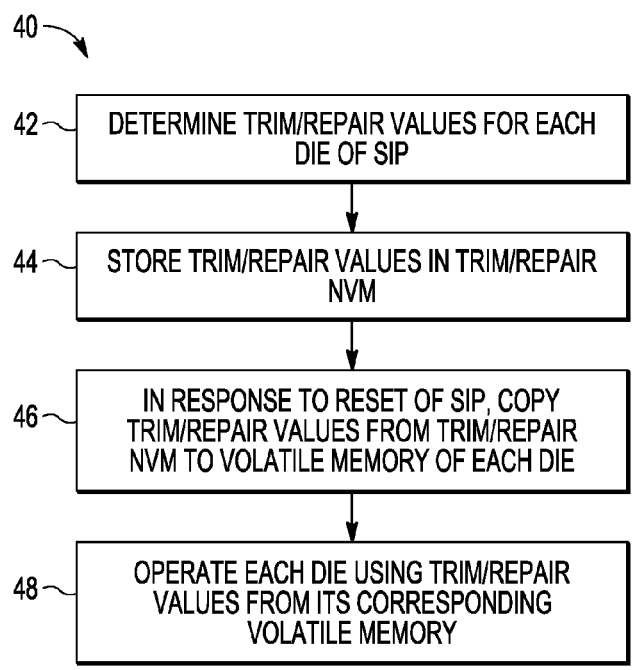
FIG. 2 is a flow diagram for operating the SiP of FIG. 1.
Figure 3:
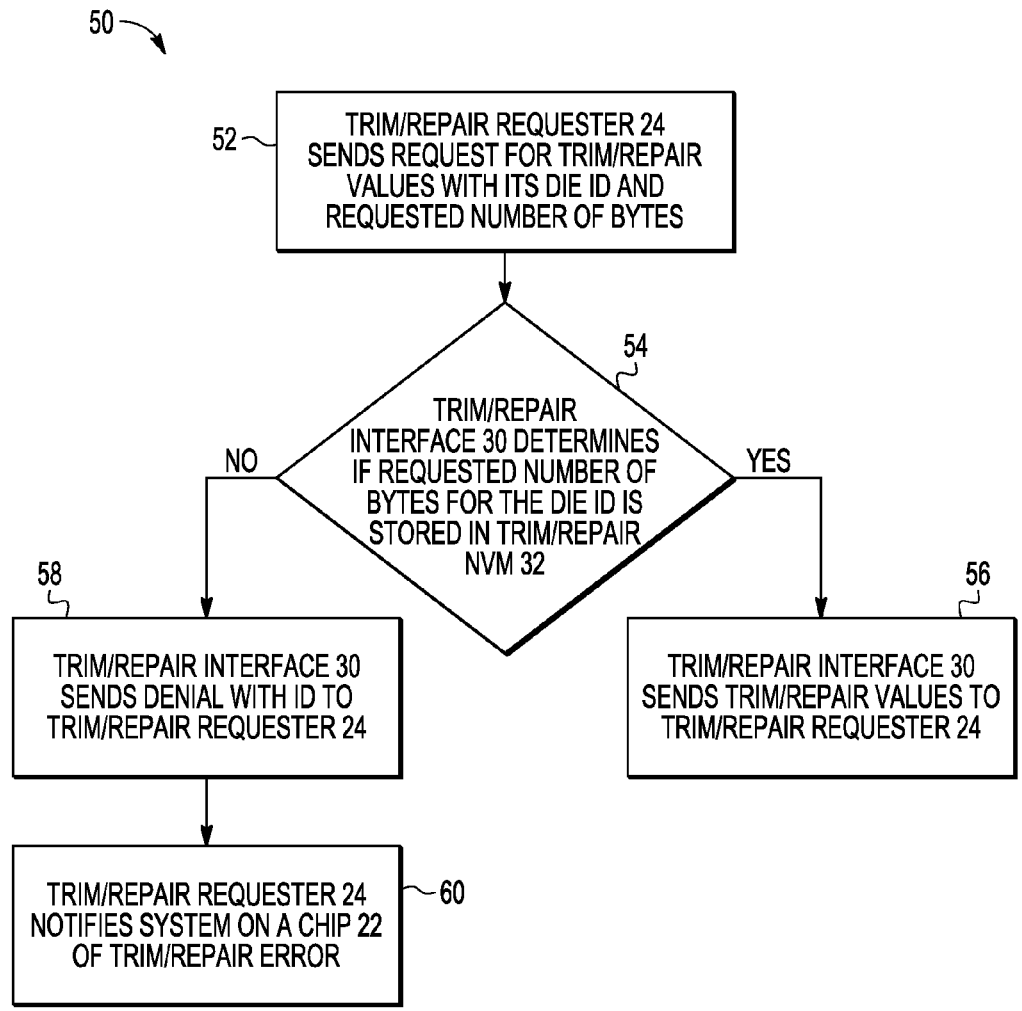
FIG. 3 is a flow diagram showing more detail of the flow diagram of FIG. 2.

Shown in FIG. 2 is a flow diagram 40 that describes an operation of a SiP relating to trim/repair operations. In a step 42, trim/repair values are determined for SoC die 12, NVM die 14, and analog die 16. This can be done at any stage in testing and even after having been packaged together as SiP 10. In a step 44, the trim/repair values are stored in trim/repair NVM 32. This is may be a permanent storage so that operations on general NVM 28 do not degrade this storage. The result is that trim/repair values for SoC die 12 and analog die 16 need not be stored in SoC die 12 and analog die 16, respectively. This type of storage is relatively convenient if the die has charge storage NVM but charge storage NVM requires some processing that is different from logic or circuits such as SoC die 12 and analog die 16. Further it may require special transistors and thus special processing to implement e-fuses as well. At a step 46, when SiP 10 experiences reset, which may be a start-up, the trim/repair values stored in trim/repair NVM are copied to the corresponding VMs 26 and 33. VMs 26 and 33 may be random access memories or other volatile memory such as registers. At a step 48, each die operates using the trim/repair values that are stored in its volatile memory. This operation can continue indefinitely using these trim/repair values. At some point, SiP will have an event, such as power down, that will result in the contents of VMs 26 and 33 being lost. The values will then be restored at the next reset which may be power up.

Shown in 3 is a flow chart 50 that is a portion of step 46 of FIG. 2 pertaining particularly to SoC die 12 making a request. In a step 52, trim/repair requester 24 sends a request for trim/repair values with its die identification (ID). This request includes the requested number of bytes. Trim/repair interface 30 determines if the requested number of bytes for the die ID is stored in trim/repair NVM 32. At a step 56, if the answer is yes, trim/repair interface 30 sends trim/repair values with the ID to trim/repair requester 24. At step 58, if the answer is no, trim/repair interface 30 sends a denial with the ID to trim/repair requester 24. At step 60, trim/repair requester 24 notifies SoC 22 of a trim/repair error. The same procedure is applicable to analog die 16 in making a trim/repair request if parallel operation is available with bus 34. On the other hand, if daisy chain operation is provided, communication between NVM die 14 and analog die 16 is through SoC die 12. Thus, the request for trim/repair values from trim/repair requester 31 is to trim/repair requester 24 that in turn makes the request to trim/repair interface 30. These requests include the ID for trim/repair requester 31. Trim/repair requester 24 then receives the trim/repair values and ID from trim/repair interface 30 and sends them to trim/repair 31.

The problem of special processing for storing trim/repair information is thus significantly alleviated for the case of a SiP by centralizing the storage of the relevant trim/repair values in a location, which may be an NVM having charge storage, that already uses the processing required for nonvolatile storage. Further though, the die that utilize trim/repair do not suffer a speed penalty because the trim/repair values for a given die are stored in volatile storage onboard that die. The volatile storage does not require special processing.

By now it should be appreciated that there has been provided a system in a package (SiP) that includes a first semiconductor die having a nonvolatile memory and trim/repair circuitry. The SiP further includes a second semiconductor die. The second semiconductor die has a volatile memory and trim/repair circuitry. The first and the second semiconductor die are in a same package. The nonvolatile memory of the first semiconductor die is configured to store trim/repair values for each of the first and the second semiconductor die. The trim/repair circuitries of the first and second semiconductor die are configured to, in response to a reset of the second semiconductor die, copy the trim/repair values from the nonvolatile memory of the first semiconductor die to the volatile memory of the second semiconductor die. The SiP may have a further characterization by which the trim/repair circuitry of the second semiconductor die is configured to, in response to the reset of the second semiconductor die, send a request to the trim/repair circuitry of the first semiconductor die, and wherein the trim/repair circuitry of the first semiconductor die, in response to the request, provides the trim/repair values from the nonvolatile memory of the first semiconductor die to the trim/repair circuitry of the second semiconductor die. The SiP may have a further characterization by which the request includes a semiconductor die identifier. The SiP may have a further characterization by which wherein the semiconductor die identifier identifies the second semiconductor die. The SiP may further include a third semiconductor die, and wherein the semiconductor identifier identifies the third semiconductor die. The SiP may further include a third semiconductor die having a volatile memory and trim/repair circuitry, wherein the first, second, and third semiconductor die are in the same package, and wherein trim/repair circuitries of the first and third semiconductor die are configured to, in response to a reset of the third semiconductor die, copy the trim/repair values from the nonvolatile memory of the first semiconductor die to the volatile memory of the third semiconductor die. The SiP may further include a third semiconductor die having a volatile memory and trim/repair circuitry, wherein the first, second, and third semiconductor die are in the same package, wherein trim/repair circuitries of the first, second, and third semiconductor die are configured to, in response to a reset of the third semiconductor die, copy the trim/repair values from the nonvolatile memory of the first semiconductor die to the volatile memory of the third semiconductor die, in which the trim/repair values are provided by the trim/repair circuitry of the first semiconductor die to the trim/repair circuitry of the second semiconductor die, and subsequently, the trim/repair values are provided by the second semiconductor die to the trim/repair circuitry of the third semiconductor die. The SiP may have a further characterization by which the second semiconductor die comprises a system on a chip. The SiP may have a further characterization by which the first semiconductor die comprises a flash memory. The SiP may have a further characterization by which the third semiconductor die is characterized as an analog die.

Also described is a method including, in a system in a package (SiP) having a first semiconductor die and a second semiconductor die packaged in a same package, receiving a reset. The method further includes, in response to the reset, accessing trim/repair values stored in a nonvolatile memory of the first semiconductor die, wherein the trim/repair values include values corresponding to each of the first and second semiconductor die. The method further includes the first semiconductor die providing the accessed trim/repair values corresponding to the second semiconductor die to the second semiconductor die. The method further includes the second semiconductor die receiving the trim/repair values corresponding to the second semiconductor die from the first semiconductor die and storing the received trim/repair values in a volatile memory of the second semiconductor die. The method may further include determining the trim/repair values for each of the first and the second semiconductor die and, after the determining and prior to the receiving the reset, storing the determined trim/repair values into the nonvolatile memory of the first semiconductor die. The method may have a further characterization by which, during normal operation of the second semiconductor die, using the trim/repair values corresponding to the second semiconductor die stored in the volatile memory. The method may further include, in response to the reset, the second semiconductor die sending a request to the first semiconductor die for the time/repair values corresponding to the second semiconductor die. The method may have a further characterization by which the request comprises a die identifier which identifies one of a group consisting of the second semiconductor die and a number of bytes requested. The method may have a further characterization by which the SiP further comprises a third semiconductor die in the same package and wherein the trim/repair values in the nonvolatile memory of the first semiconductor die includes values corresponding to the third semiconductor die and the method includes, in response to the reset, the third semiconductor die providing a request to the second semiconductor die, the second semiconductor die providing the request to the first semiconductor die, the first semiconductor die, in response to the request, providing the trim/repair values corresponding to the third semiconductor die to the second semiconductor die, the second semiconductor die providing the trim/repair values corresponding to the third semiconductor die to the third semiconductor die, and storing the trim/repair values corresponding to the third semiconductor die in volatile memory of the third semiconductor die. The method may have a further characterization by which the request comprises a die identifier which identifies the third semiconductor die.

Described also is a system in a package (SiP). The SiP includes a first semiconductor die having a nonvolatile memory and trim/repair circuitry. The SiP further includes a second semiconductor die having a volatile memory and trim/repair circuitry, wherein the first and the second semiconductor die are in a same package, wherein the nonvolatile memory of the first semiconductor die is configured to store trim/repair values for each of the first and the second semiconductor die, and wherein, the trim/repair circuitry of the second semiconductor die is configured to, in response to a reset of the second semiconductor die, provide a request to the first semiconductor die to obtain the trim/repair values for the second semiconductor die, and wherein the trim/repair circuitry of the first semiconductor die is configured to, in response to the request, access the nonvolatile memory to obtain the trim/repair values for the second semiconductor die from the nonvolatile memory and provide trim/repair values for the second semiconductor die to the second semiconductor die for storage into the volatile memory. The SiP may further include a third semiconductor die having a volatile memory and trim/repair circuitry, wherein the first, second, and third semiconductor die is in the same package, wherein the nonvolatile memory of the first semiconductor die is further configured to store trim/repair values for the third semiconductor die, and wherein the trim/repair circuitry of the third semiconductor die is configured to, in response to a reset of the third semiconductor die, provide a second request to the first semiconductor die to obtain the trim/repair values for the third semiconductor die, and wherein the trim/repair circuitry of the first semiconductor die is configured to, in response to the second request, access the nonvolatile memory to obtain the trim/repair values for the third semiconductor die from the nonvolatile memory and provide trim/repair values for the third semiconductor die for storage into the volatile memory of the third semiconductor die. The SiP may have a further characterization by which the trim/repair circuitry of the first semiconductor die is configured to provide the obtained trim/repair values for the third semiconductor die to the second semiconductor die, and the trim/repair circuitry of the second semiconductor die is configured to provide the trim/repair values for the third semiconductor die to the third semiconductor die for storage into the volatile memory of the third semiconductor die.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below. For example, other types of memories may be used than those enumerated. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A system in a package (SiP), comprising:
   a first semiconductor die having a nonvolatile memory and trim/repair circuitry; and
   a second semiconductor die having a volatile memory and trim/repair circuitry, wherein the first and the second semiconductor die are in a same package, wherein the nonvolatile memory of the first semiconductor die is configured to store trim/repair values for each of the first and the second semiconductor die, and wherein, trim/repair circuitries of the first and second semiconductor die are configured to, in response to a reset of the second semiconductor die, copy the trim/repair values from the nonvolatile memory of the first semiconductor die to the volatile memory of the second semiconductor die.

2. The SiP of claim 1, wherein the trim/repair circuitry of the second semiconductor die is configured to, in response to the reset of the second semiconductor die, send a request to the trim/repair circuitry of the first semiconductor die, and wherein the trim/repair circuitry of the first semiconductor die, in response to the request, provides the trim/repair values from the nonvolatile memory of the first semiconductor die to the trim/repair circuitry of the second semiconductor die.

3. The SiP of claim 2, wherein the request includes a semiconductor die identifier.

4. The SiP of claim 3, wherein the semiconductor die identifier identifies the second semiconductor die.

5. The SiP of claim 3, further comprising a third semiconductor die, and wherein the semiconductor identifier identifies the third semiconductor die.

6. The SiP of claim 1, further comprising:
   a third semiconductor die having a volatile memory and trim/repair circuitry, wherein the first, second, and third semiconductor die are in the same package, and wherein trim/repair circuitries of the first and third semiconductor die are configured to, in response to a reset of the third semiconductor die, copy the trim/repair values from the nonvolatile memory of the first semiconductor die to the volatile memory of the third semiconductor die.

7. The SiP of claim 1, further comprising:
   a third semiconductor die having a volatile memory and trim/repair circuitry, wherein the first, second, and third semiconductor die are in the same package, wherein trim/repair circuitries of the first, second, and third semiconductor die are configured to, in response to a reset of the third semiconductor die, copy the trim/repair values from the nonvolatile memory of the first semiconductor die to the volatile memory of the third semiconductor die, in which the trim/repair values are provided by the trim/repair circuitry of the first semiconductor die to the trim/repair circuitry of the second semiconductor die, and subsequently, the trim/repair values are provided by the second semiconductor die to the trim/repair circuitry of the third semiconductor die.

8. The SiP of claim 7, wherein the second semiconductor die comprises a system on a chip.

9. The SiP of claim 8, wherein the first semiconductor die comprises a flash memory.

10. The SiP of claim 9, wherein the third semiconductor die is characterized as an analog die.

11. A method comprising:
in a system in a package (SiP) having a first semiconductor die and a second semiconductor die packaged in a same package, receiving a reset;
in response to the reset, accessing trim/repair values stored in a nonvolatile memory of the first semiconductor die, wherein the trim/repair values include values corresponding to each of the first and second semiconductor die;
the first semiconductor die providing the accessed trim/repair values corresponding to the second semiconductor die to the second semiconductor die; and
the second semiconductor die receiving the trim/repair values corresponding to the second semiconductor die from the first semiconductor die and storing the received trim/repair values in a volatile memory of the second semiconductor die.

12. The method of claim 11, further comprising:
determining the trim/repair values for each of the first and the second semiconductor die; and
after the determining and prior to the receiving the reset, storing the determined trim/repair values into the nonvolatile memory of the first semiconductor die.

13. The method of claim 11, wherein, during normal operation of the second semiconductor die, using the trim/repair values corresponding to the second semiconductor die stored in the volatile memory.

14. The method of claim 11, further comprising:
in response to the reset, the second semiconductor die sending a request to the first semiconductor die for the time/repair values corresponding to the second semiconductor die.

15. The method of claim 14, wherein the request comprises a die identifier which identifies one of a group consisting of the second semiconductor die and a number of bytes requested.

16. The method of claim 11, wherein the SiP further comprises a third semiconductor die in the same package and wherein the trim/repair values in the nonvolatile memory of the first semiconductor die includes values corresponding to the third semiconductor die, the method further comprising:
in response to the reset, the third semiconductor die providing a request to the second semiconductor die;
the second semiconductor die providing the request to the first semiconductor die;
the first semiconductor die, in response to the request, providing the trim/repair values corresponding to the third semiconductor die to the second semiconductor die;
the second semiconductor die providing the trim/repair values corresponding to the third semiconductor die to the third semiconductor die; and
storing the trim/repair values corresponding to the third semiconductor die in volatile memory of the third semiconductor die.

17. The method of claim 16, wherein the request comprises a die identifier which identifies the third semiconductor die.

18. A system in a package (SiP), comprising:
a first semiconductor die having a nonvolatile memory and trim/repair circuitry; and
a second semiconductor die having a volatile memory and trim/repair circuitry, wherein the first and the second semiconductor die are in a same package, wherein the nonvolatile memory of the first semiconductor die is configured to store trim/repair values for each of the first and the second semiconductor die, and wherein, the trim/repair circuitry of the second semiconductor die is configured to, in response to a reset of the second semiconductor die, provide a request to the first semiconductor die to obtain the trim/repair values for the second semiconductor die, and wherein the trim/repair circuitry of the first semiconductor die is configured to, in response to the request, access the nonvolatile memory to obtain the trim/repair values for the second semiconductor die from the nonvolatile memory and provide trim/repair values for the second semiconductor die to the second semiconductor die for storage into the volatile memory.

19. The system of claim 18, further comprising:
a third semiconductor die having a volatile memory and trim/repair circuitry, wherein the first, second, and third semiconductor die is in the same package, wherein the nonvolatile memory of the first semiconductor die is further configured to store trim/repair values for the third semiconductor die, and wherein the trim/repair circuitry of the third semiconductor die is configured to, in response to a reset of the third semiconductor die, provide a second request to the first semiconductor die to obtain the trim/repair values for the third semiconductor die, and wherein the trim/repair circuitry of the first semiconductor die is configured to, in response to the second request, access the nonvolatile memory to obtain the trim/repair values for the third semiconductor die from the nonvolatile memory and provide trim/repair values for the third semiconductor die for storage into the volatile memory of the third semiconductor die.

20. The system of claim 19, wherein the trim/repair circuitry of the first semiconductor die is configured to provide the obtained trim/repair values for the third semiconductor die to the second semiconductor die, and the trim/repair circuitry of the second semiconductor die is configured to provide the trim/repair values for the third semiconductor die to the third semiconductor die for storage into the volatile memory of the third semiconductor die.

* * * * *